(12) United States Patent
Xu

(10) Patent No.: US 7,230,553 B2
(45) Date of Patent: Jun. 12, 2007

(54) PARALLEL SOURCE/CAPTURE ARCHITECTURE

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 648 days.

(21) Appl. No.: 10/749,704

(22) Filed: Dec. 31, 2003

(65) Prior Publication Data

US 2005/0149807 A1    Jul. 7, 2005

(51) Int. Cl.
  *H03M 1/10*  (2006.01)
(52) U.S. Cl. .................. 341/120; 341/118; 341/143
(58) Field of Classification Search ............. 341/118, 341/120; 324/763, 765
  See application file for complete search history.

(56) References Cited

U.S. PATENT DOCUMENTS

| 4,189,778 | A | | 2/1980 | Vogel | |
|---|---|---|---|---|---|
| 5,659,312 | A | * | 8/1997 | Sunter et al. | 341/120 |
| 6,271,781 | B1 | * | 8/2001 | Pellon | 341/143 |
| 6,449,568 | B1 | * | 9/2002 | Gerrish | 702/60 |
| 6,449,741 | B1 | | 9/2002 | Organ et al. | |
| 6,642,874 | B1 | * | 11/2003 | Lin et al. | 341/143 |
| 6,667,702 | B2 | * | 12/2003 | Sasaki et al. | 341/120 |
| 6,864,699 | B2 | * | 3/2005 | Sakayori et al. | 324/763 |
| 6,919,833 | B2 | * | 7/2005 | Mills | 341/144 |
| 2002/0180626 | A1 | * | 12/2002 | Sasaki et al. | 341/120 |
| 2003/0174079 | A1 | * | 9/2003 | Soltanian et al. | 341/118 |
| 2005/0219107 | A1 | * | 10/2005 | Guidry | 341/163 |
| 2006/0159002 | A1 | * | 7/2006 | Kim et al. | 370/201 |

FOREIGN PATENT DOCUMENTS

| JP | 58200170 | 11/1983 |
|---|---|---|
| JP | 2001281303 | 10/2001 |

OTHER PUBLICATIONS

International Search Report, Mailing Date Apr. 28, 2005.

* cited by examiner

*Primary Examiner*—Linh Nguyen
(74) *Attorney, Agent, or Firm*—Daly, Crowley, Mofford, & Durkee, LLP

(57) ABSTRACT

A test system includes a signal source coupled to one or more capture/source channels. The signal source provides a cancellation signal to the one or more channels, which may be utilized by a channel to reduce a portion of the received signal. The resulting signal is then amplified so that any errors on the signal are readily detected by the system.

19 Claims, 3 Drawing Sheets

PARALLEL SOURCE/CAPTURE ARCHITECTURE

CROSS REFERENCE TO RELATED APPLICATIONS

Not Applicable.

STATEMENT REGARDING FEDERALLY SPONSORED RESEARCH

Not Applicable.

FIELD OF THE INVENTION

The present invention relates generally to automated test equipment (ATE) for electronics, and, more particularly, to source and capture test instruments that can be used in connection with ATE.

BACKGROUND OF THE INVENTION

With an increasing semiconductor integration capability and higher analog pin count devices, there is a need for ATE to include analog source/capture instruments that can simultaneously drive and capture multiple analog channels.

One approach is to build a massively parallel instrument by duplicating the architecture of existing instruments. However, this is not a cost effective solution. Providing an economical way to perform multi-channel capture is more challenging.

An economical approach for achieving parallel capture is to use a single converter with multiplexed, parallel inputs. According to this approach, a multiplexor receives multiple signals in parallel and successively switches the inputs to the converter, thereby sharing the converter among the inputs. As the capture needs to be performed serially, however, the disadvantage of this method is the increase in capture time.

There are generally three market goals that a source/capture instrument system attempts to achieve. These are high performance, high density and low cost. Unfortunately, high performance, low-cost instruments generally do not provide high density. Similarly, low-cost, high-density instruments generally do not provide high performance, and high density, high performance instruments are generally not available at a low cost.

Referring now to FIG. 1, a graph is provided showing prior art instruments. The graph shows where various existing test instruments fall within a market space defined by performance, density, and cost. For example, instrument A offers high performance, but at a high cost and low density. Instrument B provides low cost, but suffers from low performance and low density. Instrument C offers high density; however, instrument C has an associated high cost and low performance. None of the instruments offers high performance, high density, and low cost, and none of them is reconfigurable to occupy different positions in the performance-density-cost space.

SUMMARY OF THE INVENTION

In accordance with the present invention, a testing architecture includes a signal generation core coupled to a plurality of channels. The signal generation core is configurable to provide a cancellation signal to one or more of the channels, wherein respective channels can selectively apply the cancellation signal to improve their accuracy. Depending on how the cancellation signal is applied, different combinations of performance, density, and overall cost can be achieved.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 2:
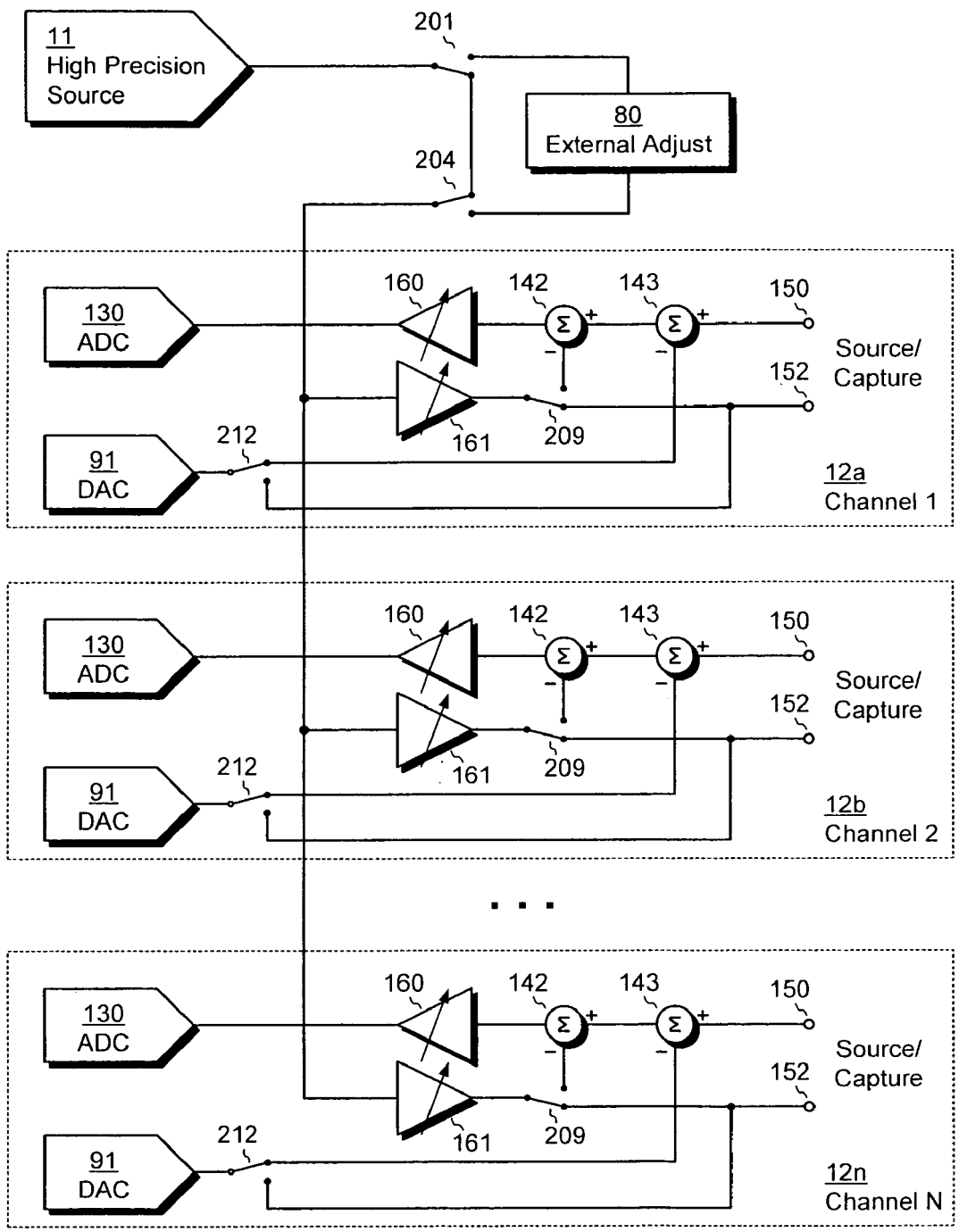
FIG. 2 is a block diagram of the test system of the present invention.

FIG. 2 shows an illustrative embodiment of the invention. As shown, an architecture 10 includes a high precision signal source 11 coupled to multiple channels, generally 12a–12n. Although three channels are shown, it should be understood that any number of channels can be provided.

The high precision source 11 is connected to the channels via switches 201 and 204. These switches, which are preferably form-C relays, can alternatively connect the high precision source 11 to the channels 12a–12n via external adjust 80. External adjust 80 is an optional, user-specified circuit than can be used vary the characteristics of the signal produced by the high precision source, in ways that are tailored to a customer's particular application. In alternative embodiments, external adjust 80 can be omitted.

Each channel 12a–12n has a source portion and a capture portion. The source portion includes a DAC 91, which is used to provide signals to a device under test. A switch 212, such as a form-C relay, connects a signal provided by the output of DAC 91 to the device under test. In particular, with the relay 212 in the "down" position, its output signal is conveyed to the output of the respective channel at node 152. The source portion preferably includes other circuitry, such as an output amplifier, but this circuitry is omitted for clarity of illustration.

The capture portion of the channel 12 includes a combiner 143, which receives a signal under test (SUT) at node 150 from a device under test. With the relay 212 in its "up" position, combiner 143 also receives a DC baseline signal at another input, from DAC 91. The output of combiner 143 is provided to an input of combiner 142. Combiner 142 also receives a cancellation signal from the source 11 via an amplifier 161 and a switch 209. The output of combiner 142 is provided to an amplifier 160. The output of the amplifier 160 is provided to an ADC 130. The combiners 142 and 143 are preferably analog adding circuits.

In ATE systems, the tester generally controls both the application of stimuli and the measurement of responses. Often, stimuli are processed by devices under test before being returned to the tester for measurement. Because the tester controls both stimuli and responses, responses generally have expected characteristics (e.g., frequency, amplitude, DC offset, phase) that either match those of the stimuli or deviate therefrom in predictable ways, based on expected behavior of the device under test. Consequently, captured signals usually have known, or at least expected, characteristics.

In the preferred embodiment, the architecture 10 is configurable in different capture modes. In its most accurate mode, the high precision source produces an AC cancellation signal that preferably equals the AC component of the expected SUT. The AC cancellation signal has substantially no DC component. When capturing a SUT, the DAC 91 produces a DC baseline signal that preferably equals the DC component of the expected SUT. The DC baseline signal preferably has substantially no AC component. The combiner 143 subtracts the DC component of the SUT, and the combiner 142 subtracts the AC component of the SUT. Assuming no noise, distortion, or other error in the SUT, the output of the combiner 142 should ideally be zero.

Because errors can never be avoided altogether, however, the output signal from the combiner 142 has a small, yet non-zero value. This signal is boosted by amplifier 160, which preferably has programmable gain, to a level that can be accurately measured by the ADC 130. A precise reading of the errors in the SUT can then be determined.

Note that the DAC 91 preferably performs two functions. When the channel 12 is used as a source, the DAC 91 provides an output signal at node 152. When the channel 12 is used as a capture, the DAC 91 provides a DC baseline signal that is used for canceling any DC component on a signal applied at node 150.

As indicated above, the above described architecture 10 can be used in different modes to provide various signal capture characteristics, depending upon the demands of the test to be performed. In a particular embodiment, the architecture is used in thee modes, which are configurable by way of the relays 209 and 212. The relays are preferably controlled by an instrument driver, which controls the architecture 10.

A first mode (i.e., "mode 1"), provides a low-cost, high-density test configuration. Mode 1 operates without signal cancellation; therefore, the signal generation core is not required. In mode 1, all the channels are configured the same way. Relays 212 are preferably in the "up" position, and relays 209 are preferably in the "down" position. These configurations allow the DC component of the SUT to be reduced, prior to measurement (via DC baseline from the DAC 91), but do not allow for reduction of the AC component of the SUT.

Taking channel 12a as an example, a SUT from the device under test is applied to node 150. Because relay 212 is in the "up" position, Combiner 143 subtracts the DC baseline from the SUT. The output of combiner 143 is provided to combiner 142. Relay 209 is configured to disconnect the AC cancellation signal from combiner 142. The output of combiner 142 is fed to signal amplifier 160, without AC cancellation, and the output of signal amplifier 160 is coupled to ADC 130. In such a manner a signal from the device under test is received. A similar configuration may be used with channels 12b–12n in this mode. Because this mode provides high density signal capture at low cost per channel, this mode is especially suitable for multi-site testing or other forms of testing where multiple, simultaneous captures are needed.

A second mode (i.e., "mode 2") can be used to provide high performance and low density. For mode 2, all channels 12a–12n except one are configured similarly to channels 12a–12n in mode 1. However, one channel, for example, channel 12n, is configured to apply signal cancellation. To effect this configuration, relay 209 is switched to the "up" position for channel 12n only. A cancellation signal is provided by source 11, through relays 201 and 204 to channel 12n. In channel 12n, the signal from source 11 is provide to amplifier 161. The output of amplifier 161 is provided through relay 209 to combiner 142. The signal from the device under test is received at node 150, and passed to the combiner 143. As with mode 1, DC cancellation is applied by the combiner 143 (via subtraction of the DC baseline). In this mode, however, AC cancellation is also provided. The output of combiner 143 is provided to combiner 142. Combiner 142 combines the cancellation signal from amplifier 161 with the received signal to produce a difference signal, the difference signal representing the difference between the received signal and the cancellation signal from the high precision source. This difference signal is coupled to amplifier 160 to produce a residual signal. The residual signal is then provided to ADC 130. This residual signal is corrected for both DC and AC components, and should ideally be zero, except to the extent that errors are present.

The architecture 10 can be configured in a third mode. In this mode (i.e., "mode 3") a parallel mixed capture with and without signal cancellation is provided. Mode 3 thus provides moderate performance and high density. In this example, all the channels 12a–12n are configured to provide a signal capture using both AC and DC signal cancellation. These channels are configured in a similar fashion as channel 12n of mode 2.

However, as compared with mode 2, where cancellation is preferably highly accurate, cancellation in mode 3 is no doubt less accurate because the same AC cancellation signal is used across multiple channels. Depending upon the testing that is being performed, the SUTs for the different channels may not be identical. A single AC cancellation signal may not, therefore, perfectly correct all channels.

Nevertheless, mode 3 achieves significant accuracy improvement over mode 1 though the use of a cancellation signal that is approximately correct. For the best use of mode 3, testing should be arranged so that a common AC cancellation signal can be used, with reasonable accuracy, for all channels. The cancellation signal may be selected, for example, to be a best fit for all the channels, such as a median of ideal cancellation signals for all the channels being used. This mode thus has favorable applications to multi-site testing. In multi-site testing, different, nominally identical devices are tested simultaneously in parallel using nominally identical stimuli. These stimuli produce nominally identical responses (SUTs), which can be tested at high density, relatively high performance, and at relatively low cost per channel.

The input to the amplifier 160 need not approach zero for a channel to realize significant improvements in capture accuracy. For example, reducing the amplitude of the signal input to the amplifier 160 by a factor of ten affords a 20 dB improvement for that channel, which is otherwise difficult to achieve.

Although mode 3 applies a single AC cancellation signal for all channels, each channel can individually provide a different DC cancellation signal (i.e., DC baseline) by appropriately programming the respective DAC 91.

Each of the channels 12a–12n preferably is provided at much lower cost than that of the high precision source 11. The high accuracy of these channels is attainable through the application of the cancellation signal from the high precision source. The cost of the high precision source is thus distributed over the number of channels to reduce the overall cost per channel.

In the preferred embodiment, amplifiers 160 and 161 have programmable gain. The gain of amplifier 160 is preferably variable to produce a large signal for input to the ADC 130.

As is known, ADC's produce more accurate readings when converting larger signals than when converting smaller signals, because larger signals are less affected by quantization errors of the ADC and noise. Varying the gain of amplifier 160 thus enables the ADC to perform at its best. The gain of amplifier 161 is preferably variable to maximize the effectiveness of is AC signal cancellation.

Figure 1:
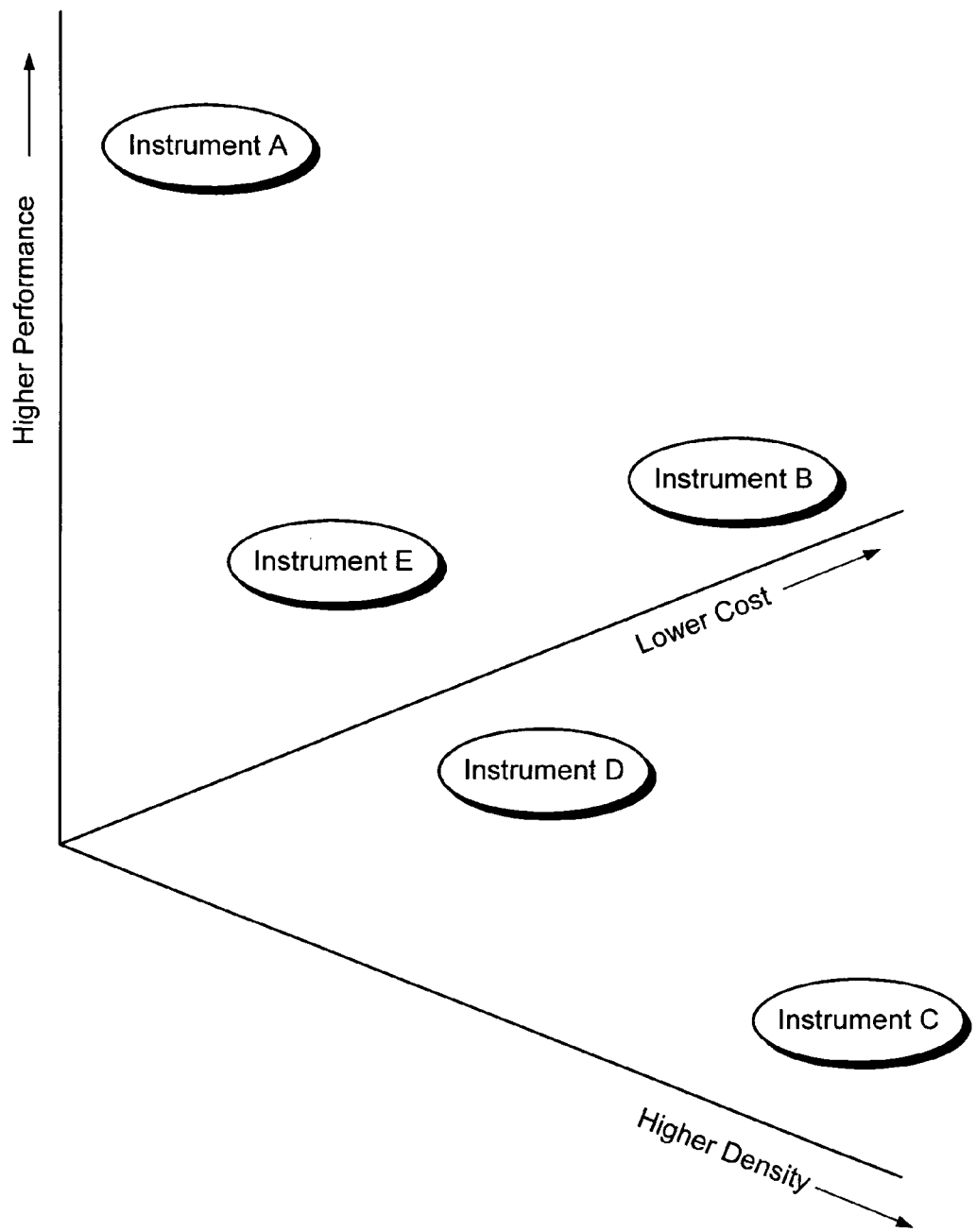
FIG. 1 is a graph showing different prior art test instruments regarding performance, cost and density.
Figure 3:
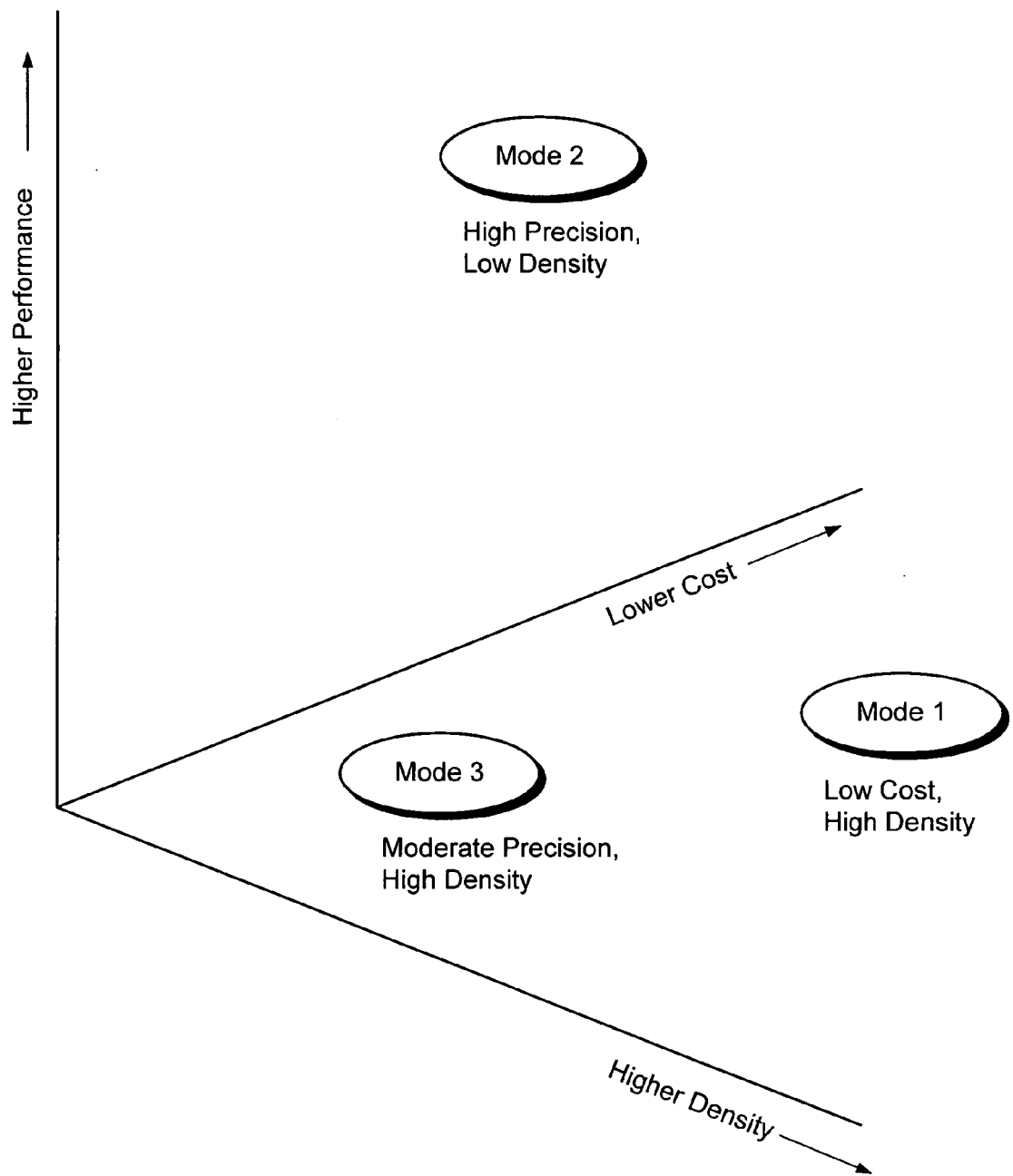
FIG. 3 is a graph showing the different modes of the present invention with relation to performance, cost and density.

Referring now to FIG. 3, a graph, similar to the graph of FIG. 1, is shown. This graph shows how the same tester, configurable into multiple modes, meets different criteria relating to performance, cost and density. When the test is in mode 1, a low cost, high-density instrument is provided. When the tester is configured in mode 2, a high precision and low density tester is achieved. In mode 3, a moderate precision, high-density tester is configured. Thus, the present test system can be configured into multiple modes, and to provide multiple functions at different cost, density and performance levels.

Having described preferred embodiments of the invention it will now become apparent to those of ordinary skill in the art that other embodiments incorporating these concepts may be used. For example, the embodiment disclosed herein includes channels that provide both source and capture functions. Alternatively, however, the channels can provide capture function only.

As shown and described, the DAC 91 provides a DC baseline to separately cancel DC offsets in the SUT on a per channel basis. Alternatively, a single DC source could be provided to adjust the DC baseline for all channels together. For example, a DC source could be incorporated into the high precision source 11, which would then correct both AC and DC components of the SUTs. Note that this configuration would not be preferred, however, because cancellation on a per channel basis is more flexible than a single cancellation for all channels.

In addition, the foregoing description prescribes three distinct modes of operation for the architecture 10. It should be understood, however, that these modes are not necessarily mutually exclusive. For instance, certain channels can be operated in mode 1 (without AC cancellation) while one or more other channels are simultaneously operated in mode 2 (with precise AC cancellation). Other channels can simultaneously be operated in mode 3 (with approximate AC cancellation), by applying the same cancellation signal that is used for the channels running in mode 2. Therefore, different channels of the architecture can be operated in different modes, simultaneously.

Additional flexibility can be achieved, although at additional cost, by providing one or more additional high precision sources 11, to which channels can selectively connect. The economic advantages of the invention are preserved, despite the additional cost, as long as the number of channels significantly exceeds the number of high precision sources. Each channel can be allocated to one particular high precision source, or channels can be switchably connectable to different sources for greater flexibility.

Accordingly, it is submitted that that the invention should not be limited to the described embodiments but rather should be limited only by the spirit and scope of the appended claims.

What is claimed is:

1. A testing architecture for automatic test equipment, comprising:
   a signal source; and
   a plurality of source/capture channels comprising one source/capture channel and remaining source/capture channels, the one source/capture channel being coupled to the signal source, the signal source being configured to provide a cancellation signal to reduce an amplitude of a signal received by the one source/capture channel, the one source/capture channel comprising:
      a first combiner configured to receive a signal under test and a baseline signal and configured to provide a first combiner output signal; and
      a second combiner configured to receive the first combiner output signal and the cancellation signal from the signal source, and configured to provide a second combiner output signal.

2. The architecture of claim 1 wherein the one source/capture channel further comprises a Digital-to-Analog Converter (DAC) configured to provide the baseline signal to the first combiner.

3. The architecture of claim 1, further comprising an external adjustment device coupled between the source and the plurality of source/capture channels.

4. The architecture of claim 1 wherein the one source/capture channel further comprises an Analog-to-Digital Converter (ADC) configured to receive the second combiner output signal.

5. The architecture of claim 4 wherein the one source/capture channel further comprises an amplifier configured to receive a signal from the signal source and configured to provide an output to the device under test.

6. The architecture of claim 4 wherein the one source/capture channel further comprises a Digital-to-Analog (DAC) configured to provide an output to the device under test.

7. The architecture of claim 4 wherein the one source/capture channel further comprises:
   an amplifier configured to receive the second combiner output signal and configured to provide an output signal to the ADC.

8. The architecture of claim 1 wherein the one source/capture channel comprises:
   an amplifier configured to receive the second combiner output signal and configured to provide a residual signal to an Analog-to-Digital Converter (ADC).

9. The architecture of claim 1 wherein the architecture is operable in a first mode wherein each channel of the plurality of source/capture channels is configured to perform a multiple capture, each channel configured substantially the same as the one source/capture channel.

10. The architecture of claim 1 wherein the architecture is operable in a second mode wherein the one source/capture channel is configured to perform a capture with signal cancellation.

11. The architecture of claim 10 wherein in the second mode the remaining channels of the plurality of channels are configured to perform a multiple capture, each of the remaining channels comprising:
   a first combiner configured to receive a signal under test and a baseline signal, and configured to provide a first combiner output signal;
   a second combiner configured to receive the first combiner output signal and configured to provide a second combiner output signal; and
   an amplifier configured to receive the second combiner output signal and configured to provide a residual signal to an ADC.

12. The architecture of claim 1 wherein the architecture is operable in a third mode wherein each channel of the plurality of source/capture channels is configured to perform a capture with signal cancellation, each channel configured substantially the same as the one source/capture channel.

13. A reconfigurable testing architecture for automatic test equipment, comprising:
a signal source; and
a plurality of channels comprising one channel and remaining channels, the channels being each configurable into a plurality of modes, each of the modes providing a different level of precision from another of the modes,
wherein the one channel comprises:
a first combiner configured to receive a signal under test and a baseline signal, and configured to provide a first combiner output signal; and
a second combiner configured to receive the first combiner output signal and a cancellation signal from the signal source, and configured to provide a second combiner output signal.

14. The architecture of claim 13 wherein the plurality of modes includes a first mode wherein each channel is configured to perform a multiple capture, each channel being configured substantially the same as the one channel, the one channel further comprising:
an amplifier receiving said second combiner output signal and providing a residual signal to an Analog-to-Digital Converter (ADC).

15. The architecture of claim 13 wherein the plurality of modes includes a second mode wherein the one channel is configured to perform a capture with the signal cancellation, the one channel further comprising:
an amplifier configured to receive the second combiner output signal and configured to provide a residual signal to an Analog-to-Digital Converter (ADC).

16. The architecture of claim 15 wherein in the second mode the remaining channels of the plurality of channels are configured to perform a multiple capture, each of the remaining channels comprising:
a first combiner configured to receive a signal under test and a baseline signal, and configured to provide a first combiner output signal;
a second combiner configured to receive the first combiner output signal and configured to provide a second combiner output signal; and
an amplifier configured to receive the second combiner output signal and configured to provide a residual signal to an Analog-to-Digital Converter (ADC).

17. The architecture of claim 13 wherein the plurality of modes includes a third mode wherein each channel of the plurality of channels is configured to perform a capture with the signal cancellation, the one channel further comprising:
an amplifier configured to receive the second combiner output signal and configured to provide a residual signal to an Analog-to-Digital Converter (ADC).

18. A testing architecture for automatic test equipment, comprising:
a signal source; and
source/capture channels comprising one source/capture channel and remaining source/capture channels, the one source/capture channel being coupled to the signal source, the signal source being configured to provide a cancellation signal to reduce an amplitude of a signal received by the one source/capture channel, the one source/capture channel comprising:
a first combiner configured to receive a signal under test and a baseline signal and configured to provide a first combiner output signal;
a second combiner configured to receive the first combiner output signal and the cancellation signal from the signal source, and configured to provide a second combiner output signal;
an Analog-to-Digital Converter (ADC) configured to receive the second combiner output signal; and
a Digital-to-Analog Converter (DAC) configured to receive the baseline signal to the first combiner.

19. The architecture of claim 18, further comprising:
a first amplifier configured to receive the second combiner output signal and configured to provide an output signal to the ADC; and
a second amplifier configured to receive a signal from the signal source and configured to provide an output to the device under test.

* * * * *